(12) United States Patent
Osako et al.

(10) Patent No.: US 8,780,568 B2
(45) Date of Patent: Jul. 15, 2014

(54) FLEXIBLE DISPLAY DEVICE (71) Applicants: Takashi Osako, Kyoto (JP); Yuji Tanaka, Osaka (JP)

(72) Inventors: Takashi Osako, Kyoto (JP); Yuji Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/983,169

(22) PCT Filed: Dec. 14, 2012

(86) PCT No.: PCT/JP2012/007995
§ 371 (c)(1),
(2), (4) Date: Aug. 1, 2013

(87) PCT Pub. No.: WO2013/099135
PCT Pub. Date: Jul. 4, 2013

(65) Prior Publication Data
US 2014/0055964 A1    Feb. 27, 2014

(30) Foreign Application Priority Data
Dec. 28, 2011 (JP) .................. 2011-288564

(51) Int. Cl.
*H05K 1/00* (2006.01)
*H05K 1/18* (2006.01)
*H05K 7/00* (2006.01)

(52) U.S. Cl.
USPC ............ 361/749; 361/748; 361/750; 361/751

(58) Field of Classification Search
CPC ........ G02F 2001/133322; G02F 2001/133328;
G02F 2001/133334; G02F 2001/133342;
G02F 2001/133354; G02F 2001/133368;
G02F 2001/13629; G02F 2001/136295;
G02F 2201/38; G02F 2201/42; G02F 2201/50;
G02F 1/13452; G02F 1/13439; G02F 1/1345;
G02F 1/136286; G02F 1/133308; G02F
1/13336; G02F 1/134363; G02F 1/136259;
G02F 2001/136263; G02F 1/1333; G02F
1/133385; G02F 1/133; H05K 2201/2009;
H05K 2203/0143; H05K 2203/0369; H05K
3/106; H05K 3/12; H05K 3/184; H05K 3/244;
H05K 3/28; H05K 3/341; H05K 3/368;
H05K 3/4007; H05K 3/4647; H05K 3/4685;
H05K 9/0096
USPC ............ 361/749, 748, 679.01, 600, 720, 736;
174/250, 260–262
See application file for complete search history.

(56) References Cited

U.S. PATENT DOCUMENTS

| 5,443,922 | A | 8/1995 | Nishizaki et al. | |
|---|---|---|---|---|
| 2008/0137275 | A1* | 6/2008 | Tada | 361/681 |
| 2009/0310314 | A1* | 12/2009 | Shinn et al. | 361/749 |

FOREIGN PATENT DOCUMENTS

| JP | 5-163488 | 6/1993 |
|---|---|---|
| JP | 10-104650 | 4/1998 |
| JP | 10-206874 | 8/1998 |
| JP | 2000-259092 | 9/2000 |
| JP | 2002-258768 | 9/2002 |
| JP | 2008-242249 | 10/2008 |
| JP | 2009-301040 | 12/2009 |

OTHER PUBLICATIONS

International Search Report and Written Opinion, dated Mar. 19, 2013, together with an English language translation of ISR.

* cited by examiner

*Primary Examiner* — Jenny L Wagner
*Assistant Examiner* — Ahmad D Barnes
(74) *Attorney, Agent, or Firm* — Greenblum & Bernstein, P.L.C.

(57) ABSTRACT

A flexible display device comprises a device substrate and a flexible circuit substrate, and achieves high reliability of electrical connection. The device substrate includes a flexible substrate, a display unit and a first terminal part. The flexible circuit substrate includes a second terminal part. An ACF including conductive particles connects the first and second terminal parts. Each conductive particle consists of a core part covered by a metal layer. An electrode layer and a cushioning layer are provided between the flexible substrate and the first terminal part. A quotient of a sum of a product of average particle diameter and elastic modulus for the core part, and a product of double average thickness and elastic modulus for the metal layer, divided by a sum of products of average thickness and elastic modulus for the first terminal part, the cushioning layer and the electrode layer, is no greater than 1.5.

9 Claims, 7 Drawing Sheets

| Test sample | Flexible substrate | Electrode layer | Cushioning layer | First terminal part | Notes |
|---|---|---|---|---|---|
| 1 | PI (38 μm)/ SiON (1 μm) | – | – | Mo (25 nm) | Metal comparison |
| 2 | PI (38 μm)/ SiON (1 μm) | – | – | Mo (75 nm) | Metal comparison |
| 3 | PI (38 μm)/ SiON (1 μm) | – | – | W (25 nm) | Metal comparison |
| 4 | PI (38 μm)/ SiON (1 μm) | – | – | W (75 nm) | Metal comparison |
| 5 | PI (38 μm)/ SiON (1 μm) | Mo (25 nm) | PL (4 μm) | Mo (75 nm) | Sandwich structure |
| 6 | PI (38 μm)/ SiON (1 μm) | W (25 nm) | PL (4 μm) | W (75 nm) | Sandwich structure |

FIG. 7C Test sample 3

FIG. 7F Test sample 6

FIG. 7B Test sample 2

FIG. 7E Test sample 5

FIG. 7A Test sample 1

FIG. 7D Test sample 4

FIG. 8A Test sample 4

FIG. 8B Test sample 6

FLEXIBLE DISPLAY DEVICE

TECHNICAL FIELD

The present invention relates to a flexible display device and in particular to a flexible display device having a connection structure wherein a device substrate and a flexible circuit substrate are electrically and physically connected through an Anisotropic Conductive Film (ACF).

BACKGROUND ART

Figure 9A:
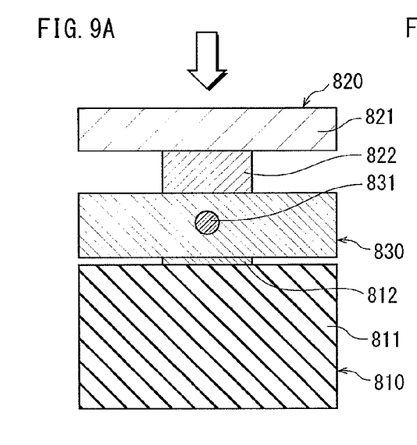
FIGS. 9A and 9B are conceptual diagrams for explaining connection structure of a display panel and a flexible circuit substrate relating to a conventional example.
Figure 9B:
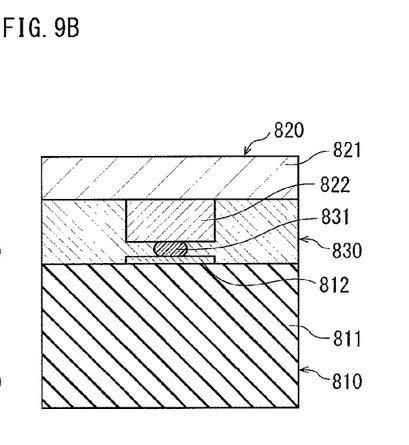

In the above connection structure, a terminal part of the device substrate and a terminal part of the flexible circuit substrate are electrically connected through conductive particles included in the ACF. More specifically, as illustrated in FIG. 9A, an ACF 830 is positioned between a terminal part 812 provided on a glass substrate 811 of a device substrate 810 and a terminal part 822 provided on a base film 821 of a flexible circuit substrate 820, and pressure is subsequently applied from above. As illustrated in FIG. 9B, when pressure is applied from above the ACF 830 is compression bonded to the device substrate 810 and the flexible circuit substrate 820, and also conductive particles 831 included in the ACF 830 are compressed by the terminal parts 812 and 822, thus electrically connecting the terminal parts 812 and 822 through the conductive particles 831. During the above, the conductive particles 831 are compressed flat, resulting in a large contact surface area between the conductive particles 831 and the terminal parts 812 and 822, thus ensuring stable electrical connection.

The terminal part 812 of the device substrate 810 is extremely thin (for example 0.5 μm) and the glass substrate 811, which is hard and thick, is disposed below the terminal part 812, therefore even if the conductive particles 831 are forcefully compressed during compression bonding, the terminal part 812 is not easily deformed. Furthermore, the terminal part 822 of the flexible circuit substrate 820 is relatively thick (for example 8 μm), and therefore is not easily deformed during compression bonding. By configuring the terminal parts 812 and 822 so that deformation thereof does not occur, the conductive particles 831 between the terminal parts 812 and 822 can be compressed into appropriate flat shapes during compression bonding.

Figure 10A:
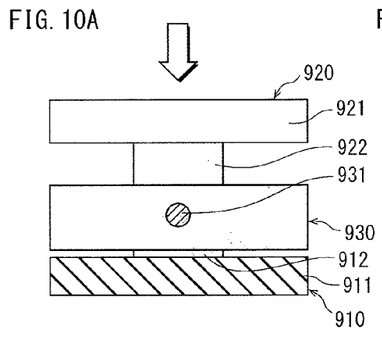
FIGS. 10A and 10B are conceptual diagrams for explaining connection structure of a display panel and a flexible circuit substrate relating to a conventional example.

In recent years, there has been development of flexible display devices in which a flexible substrate is used instead of a glass substrate. For example, as illustrated in FIG. 10A, Patent Literature 1 discloses a flexible display device in which a terminal part 912 provided on a flexible substrate 911 of a device substrate 910 and a terminal part 922 provided on a base film 921 of a flexible circuit substrate 920, are electrically connected through conductive particles 931 included in an ACF 930.

CITATION LIST

Patent Literature

[Patent Literature 1] Japanese Patent Application Publication No. 2008-242249

SUMMARY OF INVENTION

Technical Problem

Figure 10B:
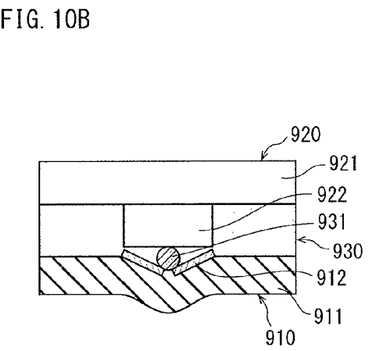

Unfortunately, in the configuration disclosed in Patent Literature 1, when pressure is applied from above while the ACF 930 is positioned between the terminal parts 912 and 922, the conductive particles 931 are forcefully compressed against the terminal part 912 causing deformation of the flexible substrate 911 as illustrated in FIG. 10B. As a consequence of the above, recesses corresponding in shape to the conductive particles 931 are formed in the terminal part 912.

When recesses such as described above are formed in the terminal part 912, the conductive particles 931 cannot be compressed into appropriate flat shapes, and thus contact surface area between the conductive particles 931 and the terminal part 912 is small and electrical continuity is unstable. Furthermore, the above results in thinning in regions of the terminal part 912 where the recesses are located, which also causes instability of electrical continuity. In a situation where the conductive particles 931 are compressed forcefully against the terminal part 912, not only are recesses formed, but a crack may also form in the terminal part 912. The above causes even greater instability of contact between the conductive particles 931 and the terminal part 912, and may result in a defect in electrical continuity. In particular, a defect in electrical continuity may easily occur when the flexible display device is being used while in a bent state.

In light of the above problem, an aim of the present invention is to provide a flexible display device in which a terminal part of a device substrate and a terminal part of a flexible circuit substrate are electrically connected through an ACF with a high degree of reliability.

Solution to Problem

A flexible display device relating to one aspect of the present invention comprises: a device substrate including a flexible substrate, and a display unit and a first terminal part which are formed above the flexible substrate; a flexible circuit substrate including a second terminal part; and an anisotropic conductive film including conductive particles and connecting the first terminal part electrically and physically to the second terminal part, wherein an electrode layer and a cushioning layer are provided between the flexible substrate and the first terminal part, each of the conductive particles consists substantially of a core part and a metal layer which covers the core part, a sum of a product of average particle diameter and elastic modulus for the core part (referred to below as a "core part product") and a product of double average thickness and elastic modulus for the metal layer (referred to below as a "metal layer product"), is a first sum value, a sum of a product of average thickness and elastic modulus for the first terminal part (referred to below as a "first terminal part product"), a product of average thickness and elastic modulus for the cushioning layer (referred to below as a "cushioning layer product"), and a product of average thickness and elastic modulus for the electrode layer (referred to below as an "electrode layer product"), is a second sum value, and a quotient value of the first sum value divided by the second sum value is no greater than 1.5.

In the present application, "average particle diameter" refers to particle diameter at an integrated value of 50% for a particle distribution calculated using a laser diffraction/diffusion technique.

Advantageous Effects of Invention

In the flexible display device relating to one aspect of the present invention, the electrode layer and the cushioning layer are provided between the flexible substrate and the first terminal part, and the quotient value of the sum of the core part product and the metal layer product, divided by the sum of the first terminal part product, the cushioning layer product and the electrode layer product, is no greater than 1.5. Through the above, a preferable distortion balance can be maintained between upward and downward directions relative to an interface between the conductive particles and the first terminal part, thus preventing deformation of the first terminal part. Consequently, the conductive particles can be compressed into appropriate flat shapes, ensuring stable electrical connection between the conductive particles of the first terminal part, and thus reducing probability of a defect occurring in electrical continuity.

DESCRIPTION OF EMBODIMENTS

[Overview of One Aspect of the Present Invention]

A flexible display device relating to one aspect of the present invention comprises: a device substrate including a flexible substrate, and a display unit and a first terminal part which are formed above the flexible substrate; a flexible circuit substrate including a second terminal part; and an anisotropic conductive film including conductive particles and connecting the first terminal part electrically and physically to the second terminal part, wherein an electrode layer and a cushioning layer are provided between the flexible substrate and the first terminal part, each of the conductive particles consists substantially of a core part and a metal layer which covers the core part, a sum of a product of average particle diameter and elastic modulus for the core part and a product of double average thickness and elastic modulus for the metal layer, is a first sum value, a sum of a product of average thickness and elastic modulus for the first terminal part, a product of average thickness and elastic modulus for the cushioning layer, and a product of average thickness and elastic modulus for the electrode layer, is a second sum value, and a quotient value of the first sum value divided by the second sum value is no greater than 1.5.

A specified feature of the flexible display device relating to the one aspect of the present invention is that the cushioning layer may be formed from a resin.

Another specified feature of the flexible display device relating to the one aspect of the present invention is that a base layer which is continuous through a display unit formation region where the display unit is formed, a terminal part formation region where the first terminal part is formed, and an intermediate region between the display unit formation region and the terminal part formation region, may be provided between the flexible substrate and the display unit, and the cushioning layer may be a part of the base layer located in the terminal part formation region.

[Display Device]

The following explains the flexible display device relating to one aspect of the present invention with reference to the drawings. Elements in the drawings are not necessarily illustrated to scale.

Figure 1:
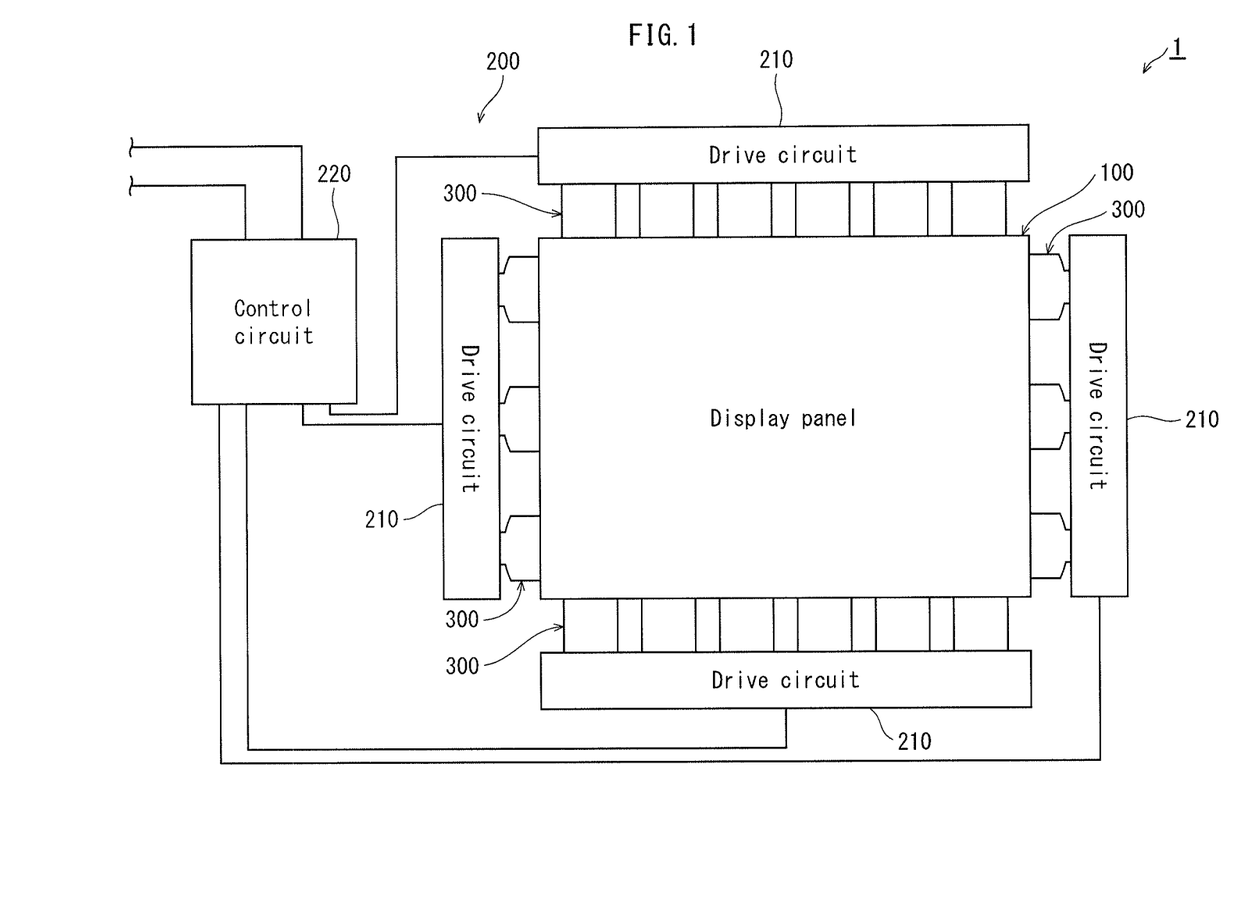
FIG. 1 illustrates overall configuration of a flexible display device relating to one aspect of the present invention.

FIG. 1 illustrates overall configuration of the flexible display device relating to the one aspect of the present invention. As illustrated in FIG. 1, a flexible display device 1 relating to one aspect of the present invention includes a display panel 100, a drive control unit 200 and a plurality of flexible circuit substrates 300.

The display panel 100 is for example an organic Electro Luminescence (EL) panel which utilizes EL effects. The drive control unit 200 is configured by four drive circuits 210 and a control circuit 220. The flexible circuit substrates 300 have ICs mounted thereon configuring the drive circuits 210.

Figure 2:
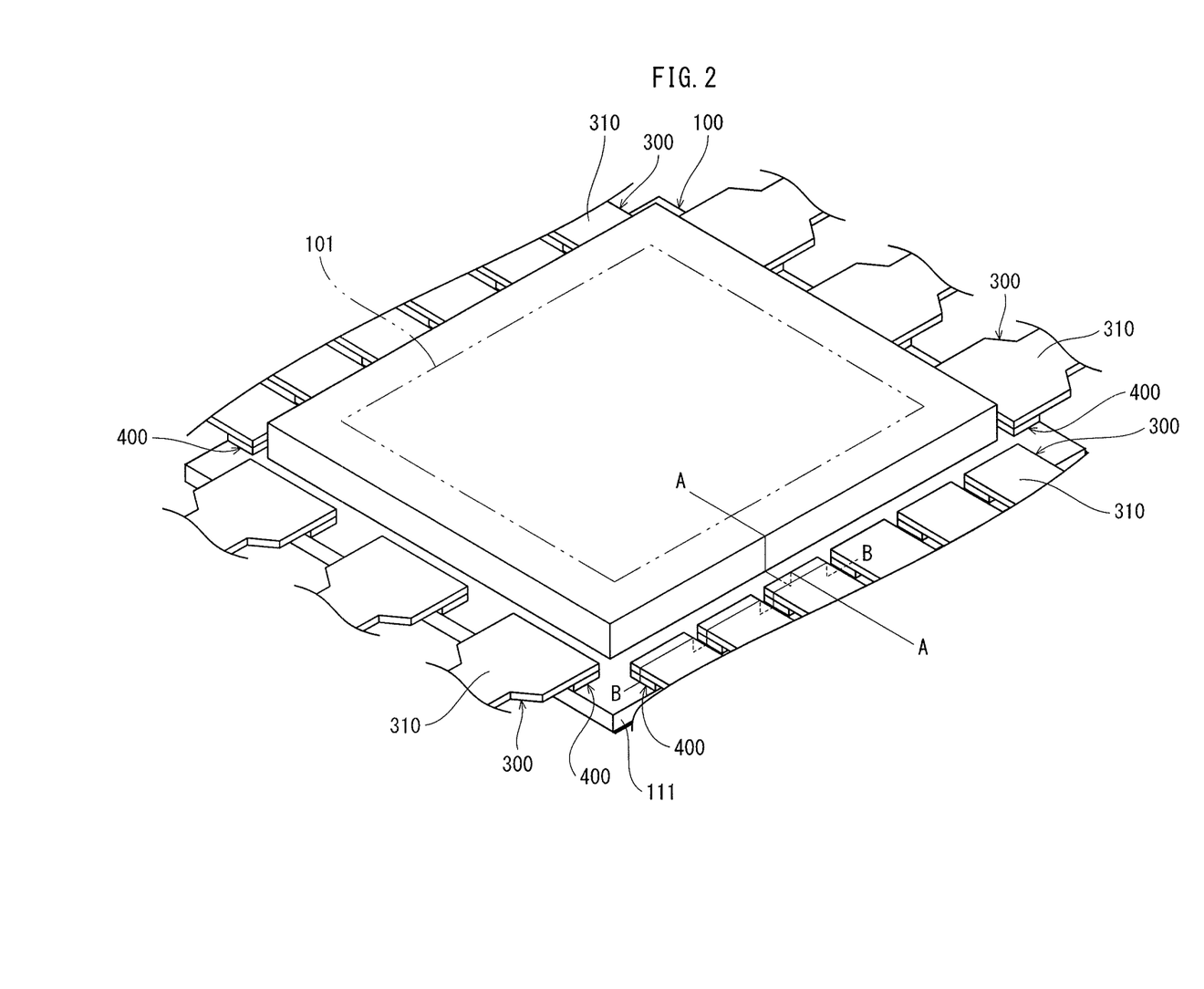
FIG. 2 is a perspective diagram illustrating connection structure of a display panel and flexible circuit substrates relating one aspect of the present invention.

FIG. 2 is a perspective diagram illustrating connection structure of a display panel and flexible circuit substrates relating to one aspect of the present invention.

Figure 3:
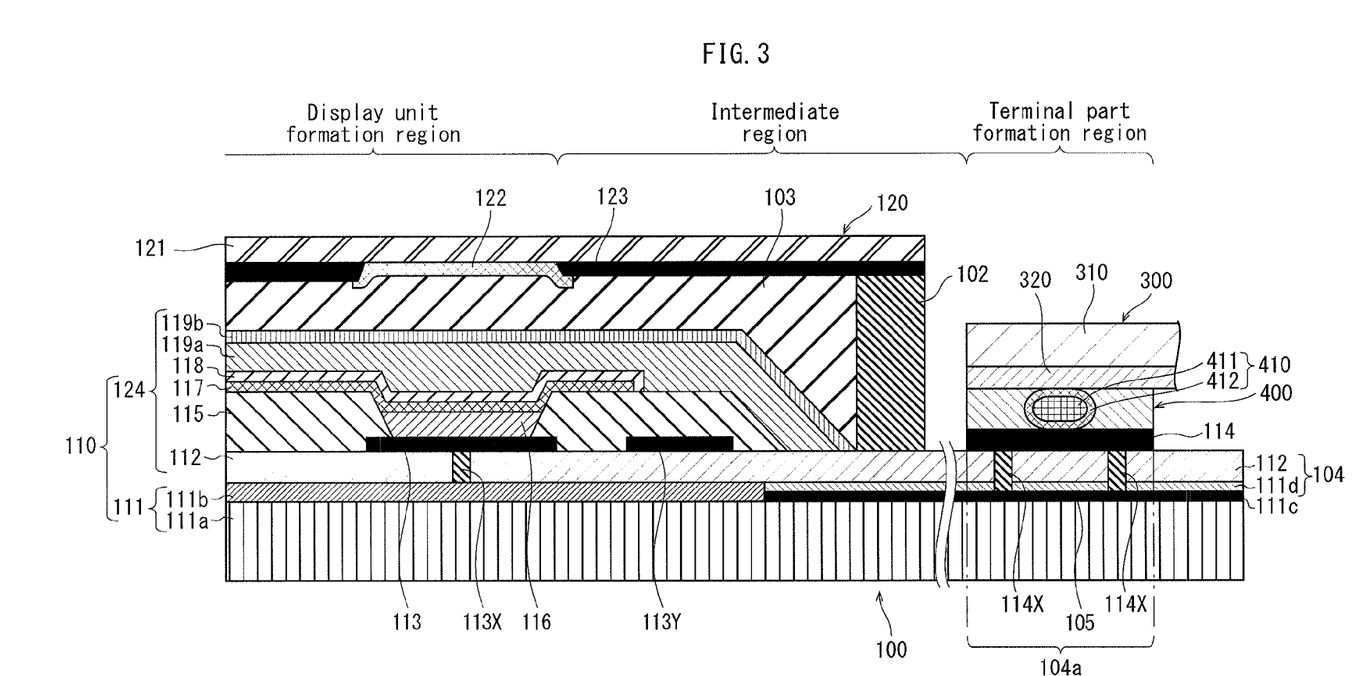
FIG. 3 is a cross-sectional diagram along line A-A in FIG. 2, illustrating a flexible display device relating to an embodiment.
Figure 4:
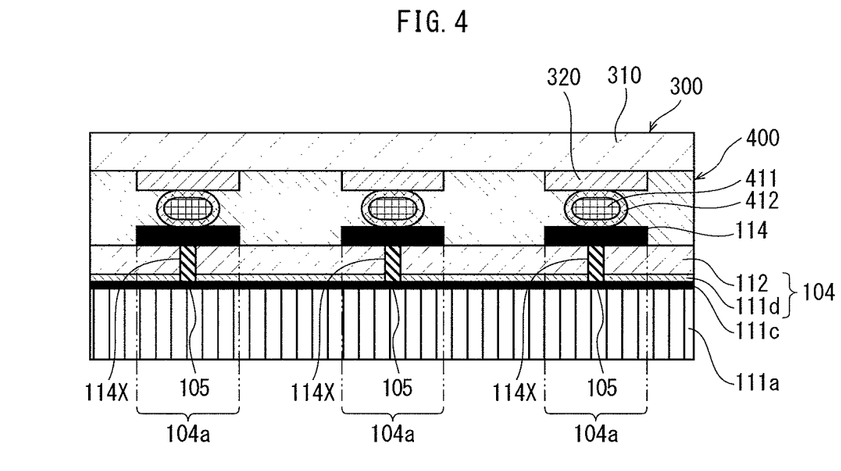
FIG. 4 is a cross-sectional diagram along line B-B in FIG. 2, illustrating the flexible display device relating to the embodiment.

FIG. 3 is a cross-sectional diagram along line A-A in FIG. 2, illustrating a flexible display device relating to an embodiment. FIG. 4 is a cross-sectional diagram along line B-B in FIG. 2, illustrating the flexible display device relating to the embodiment.

As illustrated in FIG. 2, a display unit 101 (illustrated by a broken-line in FIG. 2) is formed in a central region above a TFT substrate 111 (also above a flexible substrate 111*a*) of the display panel 100. As illustrated in FIGS. 3 and 4, a plurality of first terminal parts 114 are formed on each of four sides of a peripheral region which surrounds the central region. Herein, a region in which the display unit 101 is formed is referred to as a display unit formation region, a region in which the first terminal parts 114 are formed is referred to as a terminal part formation region, and a region between the display unit formation region and the terminal part formation unit is referred to as an intermediate region.

Each of the flexible circuit substrates 300 may for example consist of a base film 310, formed from a polyimide (PI), on which a conducting pattern (not illustrated) is formed using copper or the like. A plurality of second terminal parts 320 which are electrically connected to the conduction pattern, are formed on a lower surface (surface facing toward the TFT substrate 111) of the base film 310, at an end of the base film 310 closest to the display panel 100. The second terminal parts 320 correspond in position to the first terminal parts 114.

At each of the four sides of the TFT substrate 111, the end of each of the base films 310 closest to the display panel 100 is electrically connected to a peripheral region of the TFT substrate 111 through an ACF 400. The ACF 400 is a thermally curable resin which is molded into a film shape and is positioned between the first terminal parts 114 and the second terminal parts 320. The ACF 400 is attached to the first terminal parts 114 and the second terminal parts 320 by thermocompression bonding.

The ACF 400 includes conductive particles 410. Each of the first terminal parts 114 of the display panel 100 is electrically connected to a corresponding second terminal part 320 of the flexible circuit substrate 300 through the conductive particles 410 in the ACF 400. Each of the conductive particles 410 may for example consist of a core part 411 formed from a resin material such as PP (polypropylene), and a metal layer 412, formed from a metal such as Ni (nickel) or Au (gold), which coats the core part 411.

The first terminal parts 114 are not required to be formed on all four sides of the peripheral region of the TFT substrate 111. The first terminal parts 114 may alternatively be formed on just one, two or three of the sides of the peripheral region. Furthermore, the drive circuits 210 and the flexible circuit substrates 300 are only required to be attached to sides on which the first terminal parts 114 are formed.

[Display Panel]

The display panel 100 may for example include a device substrate 110 and a CF (Color Filter) substrate 120. The device substrate 110 and the CF substrate 120 are disposed in opposing positions to one another and are plied together.

The CF substrate 120 is positioned above the device substrate 110 by a sealing member 102 and resin is filled between the device substrate 110 and the CF substrate 120 to form a resin layer 103. The sealing member 102 and the resin layer 103 are formed from a dense resin material such as a silicone resin or an acrylic resin. The sealing member 102 and the resin layer 103 seal the display unit 101 of the device substrate 110 preventing moisture, gas and the like from coming into contact with organic light-emitting layers 116.

The display unit 101 is configured by a plurality of pixels arranged in a matrix and is formed on an upper surface of a TFT substrate 111 which is a main surface closest to the CF substrate 120 (in explanation below of layers configuring the device substrate 110, a surface facing toward the CF substrate 120 is also referred to as an upper surface). R (Red), G (Green) or B (Blue) color light emitted from each of the pixels passes through the CF substrate 120, causing display of a color image on a front surface of the display panel 100. The first terminal parts 114 are provided on a peripheral region of the upper surface of the TFT substrate 111 which surrounds the display unit 101.

The present embodiment is explained for an example in which the CF substrate 120 is provided, however provision of a CF substrate is not essential.

<Device Substrate>

The device substrate 110 is formed from the TFT substrate 111 and an EL substrate 124. The EL substrate 124 has a layered structure wherein a planarizing film 112, lower electrodes 113, contact holes 113X, anode rings 113Y, the first terminal parts 114, banks 115, the organic light-emitting layers 116, an electron transport layer 117, an upper electrode 118, a sealing layer 119a, a protective film 119b and the like, are layered on an upper surface of the TFT substrate 111. The pixels configuring the display unit 101 of the device substrate 110 are top-emission organic EL pixels configured by the lower electrodes 113, the organic light-emitting layers 116, the electron transport layer 117 and the upper electrode 118.

The TFT substrate 111 may for example have a structure including a flexible substrate 111a and a TFT layer 111b formed on an upper surface of the flexible substrate 111a. The TFT layer 111b may for example include SD wiring 111c and a passivation film 111d.

The flexible substrate 111a is formed from a resin material such as a polyimide, aromatic polyimide, polyether imide, polyester sulfone, polyethylene, ultra high molecular weight polyethylene, polyvinyl alcohol, polycarbonate, polystyrene, polyethylene terephthalate, polyethylene naphthalate, polybutylene terephthalate, polyphenylene sulfide, polypropylene, polyamide, aramid, polyamide imide, acrylonitrile butadiene styrene, cyclic olefin copolymer or polyvinyl chloride.

In the embodiment illustrated in FIGS. 3 and 4, the passivation film 111d and the planarizing film 112 configure a base layer 104. Parts of the base layer 104 corresponding to the first terminal parts 114 function as a cushioning layers 104a.

As illustrated in FIG. 4, a single cushioning layer may be formed in areas corresponding one-to-one to the plurality of first terminal parts and continuously therebetween. Alternatively, the cushioning layer having the specific features of the present invention may be formed as a plurality of independent cushioning layers, each formed in an area corresponding to one of the plurality of first teiminal parts. In other words, in FIG. 4 the cushioning layer having the specific features of the present invention may be formed only by each cushioning layer 104a. The SD wiring 111c is formed from a conducting material such as Ag, Cu, Ti, Mo, Al, W or an alloy thereof. The SD wiring 111c is electrically connected to a leader line (not illustrated) of the TFT substrate 111. The SD wiring 111c is electrically connected to each of the first terminal parts 114 through a connecting member 114X which passes through the passivation film 111d and the planarizing film 112.

A part of the SD wiring 111c located in the terminal part formation region configures an electrode layer 105. The electrode layer 105 is disposed on the upper surface of the flexible substrate 111a, between the flexible substrate 111a and the first terminal parts 114. Furthermore, the electrode layer 105 may also be disposed on the upper surface of the flexible substrate 111a in regions other than just the terminal part formation region. Preferably the electrode layer should be thinner than each of the first terminal parts.

The passivation film 111d is formed for example from SiO (silicon oxide), SiN (silicon nitride), a fluorine resin, or a water soluble resin such as PVA (polyvinyl alcohol). The passivation film 111d covers the SD wiring 111c, thus protecting the SD wiring 111c.

The planarizing film 112 is formed from an insulating material such as a polyimide resin or an acrylic resin. The planarizing film 112 flattens unevenness of an upper surface of the passivation film 111d. Provision of the planarizing film 112 is not essential.

The lower electrodes (pixel electrodes) 113 are electrically connected to the TFT layer 111b through the contact holes 113X. The lower electrodes 113 may have a double-layer structure consisting of a metal layer and a metal oxide layer. The metal layer is formed from a reflective conducting material such as Ag (silver), APC (silver, palladium, and copper alloy), ARA (silver, rubidium, and gold alloy), MoCr (molybdenum and chromium alloy) or NiCr (nickel and chromium alloy). The metal layer is formed as a matrix in areas corresponding one-to-one to the pixels. The metal oxide layer is formed from a conducting material such as ITO (indium tin oxide) or IZO (indium zinc oxide). The metal oxide layer is formed above the metal layer, covering the metal layer.

Each of the first terminal parts 114 is electrically connected to a leader line (not illustrated) of the TFT substrate 111. Each of the first terminal parts 114 may have a double-layer structure consisting of a metal layer and a metal oxide layer. The metal layers are formed from a conducting material such as Ag, Cu, Ti, Mo, Al, APC, ARA, MoCr or NiCr. The metal layers are formed along a peripheral edge of the TFT substrate 111, on each of the four sides of the peripheral region of the TFT substrate 111, and are arranged in groups of two or more metal layers with intervals between each of the groups. The metal oxide layers are formed from ITO, IZO or the like. Each metal oxide layer is formed above a corresponding metal layer, covering the metal layer. The first terminal parts can be formed from the same material and through the same process as the lower electrodes (pixel electrodes) of the display unit. If the first terminal parts are formed through the same process, a separate process for forming the first terminal parts is not required, thus simplifying the manufacturing process of the flexible display device. The banks 115 are formed from an insulating organic material such as an acrylic resin, a polyimide resin or a novolac phenol resin. The banks 115 are formed in the central region of the TFT substrate 111, avoiding areas in which the lower electrodes 113 are formed. The banks 115 may be pixel banks having a lattice structure or may be line banks having a stripe structure.

The organic light-emitting layers 116 are formed in areas corresponding one-to-one to the pixels, which are defined by the banks 115. When the display panel 100 is driven, each of the organic light-emitting layers 116 emits R, G or B color light due to re-combination of holes and electrons. Each of the organic light-emitting layers 116 is formed from an organic material including a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine or rare earth metal complex as recited in Japanese Patent Application Publication No. H05-163488. The organic material used to form the organic light-emitting layers 116 may alternatively include a polymeric material such as polyphenylene vinylene or derivative thereof, polyacetylene or derivative thereof, polyphenylene (PP) or derivative thereof, polyparaphenyleneethylene or derivative thereof, poly-3-hexylthiophene (P3HT) or derivative thereof, polyfluorene (PF) or derivative thereof, or the like.

The electron transport layer 117 is formed for example from barium, phthalocyanine, lithium fluoride, or a mixture thereof. The electron transport layer 117 has a function of transporting electrons injected from the upper electrode 118 to the organic light-emitting layers 116.

The upper electrode 118 is a transparent electrode formed from a light-transmitting material such as ITO or IZO. The upper electrode 118 is formed over approximately the entire area of the display part 101 so as to cover upper surfaces of the banks 115 and the organic light-emitting layers 116.

The sealing layer 119a is a layer which for example covers and seals the display unit 101. The sealing layer 119a is formed from a light-transmitting resin such as a silicone resin or an acrylic resin, and is formed above the upper electrode 118.

The protective film 119b is a film which covers and seals the display unit 101, and prevents moisture, gas or the like from coming into contact with the organic light-emitting layers 116. The protective film 119b is formed from a light-transmitting material such as SiN, SiO, SiON (silicon oxynitride), SiC (silicon carbide), SiOC (silicon oxycarbide), $Al_2O_3$ (aluminum oxide) or AlN (aluminum nitride), and is formed above the sealing layer 119a. Through formation of the protective film 119b above the sealing layer 119a, moisture, gas or the like is prevented from entering into the sealing layer 119a, even if sealing deficiencies called pinholes are present in the sealing layer 119a.

With regards to the layered structure of the device substrate 110 explained above, one or more additional layers may be formed between the lower electrodes 113 and the organic light-emitting layers 116, such as a hole transport layer, hole injection layer or the like. Furthermore, one or more additional layers may be formed between the organic light-emitting layers 116 and the upper electrode 118, such as an electron injection layer.

<CF Substrate>

The CF substrate 120 includes a flexible substrate 121, R, G and B color filters 122 and a black matrix layer 123. The color filters 122 and the black matrix layer 123 are formed on a lower surface (a main surface closest to the device substrate 110) of the flexible substrate 121. The R, G and B color filters 122 are transparent layers that are transmissive of visible light of wavelengths corresponding to R, G and B colors respectively. Each of the color filters 122 is formed from a commonly known resin material or the like. The color filters 122 are formed in regions corresponding one-to-one to the pixels. The black matrix layer 123 is a black resin layer formed in order to prevent external light from entering inside the panel, prevent internal components from being seen through the CF substrate 120, and reduce reflection of external light thus improving contrast of the display panel 100. The black matrix layer 123 is formed, for example, from an ultraviolet curable resin material containing black pigment with high light-absorbing and light-blocking properties.

<Cushioning Layer>

(Cushioning Layer Configuration)

As illustrated in FIGS. 3 and 4, in the device substrate 110 relating to the present embodiment, the base layer 104 is provided over the whole of the upper surface of the flexible substrate 111a. In other words, the base layer 104 is provided continuously through the display unit formation region, the terminal part formation region and the intermediate region. Provision of the base layer 104 in the terminal formation region is not essential. However, in the device substrate 110 relating to the present embodiment, by providing the base layer 104 over the whole upper surface of the flexible substrate 111a, in other words by extending the base layer 104 through the terminal formation region, a part of the base layer 104 located in the terminal formation region can be used as the cushioning layer 104a in order to prevent deformation of the first terminal parts 114. Through a configuration such as described above, in which part of the base layer 104 is used as the cushioning layer 104a, a separate process is not required for forming the cushioning layer 104a, thus simplifying the manufacturing process of the display panel 100.

More specifically, the cushioning layer 104a is configured by a part of a gate wiring layer in the terminal part formation region, a part of a gate insulation film in the terminal part formation region, a part of a partition wall in the terminal part formation region, a part of the SD wiring layer 111c in the terminal part formation region, a part of the passivation film 111d in the terminal part formation region, and a part of the planarizing film 112 in the terminal part formation region. Provision of the cushioning layer 104a below the first terminal parts 114 prevents deformation of the first terminal parts 114 when pressure is applied during compression bonding of the ACF 400.

(Average Thickness and Elastic Modulus of Cushioning Layer)

The cushioning layer 104a may for example have a thickness of 3.75 μm and elastic modulus of approximately 1.5 GPa. Elastic modulus of the passivation film 111d and the planarizing film 112, which configure the cushioning layer 104a, may also for example be approximately 1.5 GPa. The above layers are not limited to the thickness and elastic modulus described above.

(Deformation Prevention Effect of Cushioning Layer)

In the device substrate 110 relating to the present embodiment, each of the first terminal parts 114 is not easily deformed when pressure is applied during compression bonding of the ACF 400, due to provision of the cushioning layer 104a below the first terminal part 114. The following explains reasoning behind the above effect.

For example, suppose that the flexible substrate 111a is pliable and has average thickness of 38 μm and elastic modulus of 3 GPa to 7 GPa (when formed from a polyimide). The first terminal part 114 is a thin layer with a thickness of 0.2 Inn for example. In the above situation, the flexible substrate 111a is pliable and the first terminal part 114 is a thin layer, therefore in a conventional device substrate in which no cushioning layer 104a is provided, a large amount of deformation of the first terminal part occurs when pressure is applied during compression bonding of the ACF.

In contrast to the above, in the device substrate 110 relating to the present embodiment, the cushioning layer 104a is provided below the first terminal part 114. Due to provision of the cushioning layer 104a, repulsive power from the cushioning layer 104a influences the first terminal part 114, thus causing the first terminal part 114 to press back against the conductive particles 410 with more force. As a consequence of the above, the conductive particles 410 can be compressed more easily.

In the device substrate 110 relating to the present embodiment, a sum of a product of average particle diameter and elastic modulus for the core part 411 (referred to below a "core part 411 product"), and a product of double average thickness and elastic modulus for the metal layer 412 (referred to below as a "metal layer 412 product"), is a first sum value, a sum of a product of average thickness and elastic modulus for the first terminal part 114 (referred to below as a "first terminal part 114 product"), a product of average thickness and elastic modulus for the cushioning layer 104a (referred to below as a "cushioning layer 104a product"), and a product of average thickness and elastic modulus for the electrode layer 105 (referred to below as an "electrode layer 105 product"), is a second sum value, and a quotient value of the first sum value divided by the second sum value is no greater than 1.5. Through adjustment during manufacturing so that the quotient value is no greater than 1.5, deformation in upward and downward directions relative to an interface between the conductive particles 410 and the first terminal part 114 can be balanced.

The following explains distortion balance in detail. According to Hooke's law, a relationship shown in MATH 1 holds true where σ represents stress, E represents elastic modulus and ε represents distortion.

$$\sigma = E \times \epsilon \quad \text{[MATH 1]}$$

Furthermore, a relationship shown in MATH 2 holds true where A represents cross-sectional area (thickness×width) of the cushioning layer 104a, and F represents force.

$$\sigma = F/A \quad \text{[MATH 2]}$$

Herein, force (F) is fixed, elastic modulus (E) is an inherent value of the material, and width of the cushioning layer 104a is also fixed. Therefore, using MATH 1 and MATH 2, distortion (ε) can be represented as shown below in MATH 3.

$$\epsilon \approx 1/(\text{thickness} \times E) \quad \text{[MATH 3]}$$

In other words, deformation of the core part 411, the metal layer 412, the first terminal part 114, the cushioning layer 104a and the electrode layer 105 can be expressed using the core part 411 product, the metal layer 412 product, the first terminal part 114 product, the cushioning layer 104a product and the electrode layer 105 product respectively. The higher the product corresponding to each of the configuration elements listed above, the smaller deformation of the configuration element.

Distortion balance in upward and downward directions relative to the interface between the conductive particles 410 and the first terminal part 114 can be adjusted by adjusting the quotient value of the sum of the core part 411 product and the metal layer 412 product, divided by the sum of the first terminal part 114 product, the cushioning layer 104a product and the electrode layer 105 product. As described further below, testing confirmed that by setting the quotient value as no greater than 1.5, deformation of the first terminal part 114 can be effectively prevented. Preferably, the quotient value of the sum of the core part 411 product and the metal layer 412 product, divided by the sum of the first terminal part 114 product, the cushioning layer 104a product and the electrode layer 105 product should be at least $1.5 \times 10^{-3}$.

Distortion balance is explained using configuration of the present embodiment as an example.

First consider the sum of the core part 411 product and the metal layer 412 product. For example, if the core part 411 is formed from PP and has elastic modulus of approximately 1.5 GPa and an average particle diameter of 4.0 μm, the core part 411 product is approximately 6.0 GPa·μm (approx. 1.5 GPa× 4.0 μm). Also, if for example the metal layer 412 is formed from Ni and has elastic modulus of approximately 200 GPa and average thickness of 0.1 μm, the metal layer 412 product is approximately 40 GPa·μm (approx. 200 GPa×0.1 μm×2). Therefore, the sum of the core part 411 product and the metal layer 412 product is approximately 46 GPa·μm.

Next consider the sum of the first terminal part 114 product and the cushioning layer 104a product. For example, if the first terminal part 114 consists of an ACL metal layer having elastic modulus of approximately 70 GPa and average thickness of 0.2 μm, and an IZO metal oxide layer having elastic modulus of approximately 11 GPa and average thickness of 0.016 μm, the first terminal part 114 product is approximately 14.2 GPa·μm (approx. 70 GPa×0.2 μm+approx. 11 GPa× 0.016 μm). Also, if the cushioning layer 104a has elastic modulus of approximately 1.5 GPa and average thickness of 3.75 um as described above, the cushioning layer 104a product is approximately 5.6 GPa·μm (approx. 1.5 GPa×3.75 μm). Furthermore, if the electrode layer 105 is formed from molybdenum, and has elastic modulus of approximately 290 GPa and average thickness of 0.075 μm, the electrode layer 105 product is approximately 21.8 GPa·μm (approx. 290 GPa× 0.075 μm). Therefore, the sum of the first terminal part 114 product, the cushioning layer 104a product, and the electrode layer 105 product is approximately 41.6 GPa·μm.

Using the above values, the quotient value of the sum of the core part 411 product and the metal layer 412 product, divided by the sum of the first terminal part 114 product, the cushioning layer 104a product and the electrode layer 105 product, can be calculated to be 1.1. The quotient value of 1.1 is not greater than 1.5, therefore a preferable distortion balance is achieved between the upward and downward directions relative to the interface between the conductive particles 410 and the first terminal part 114.

Figure 5A:
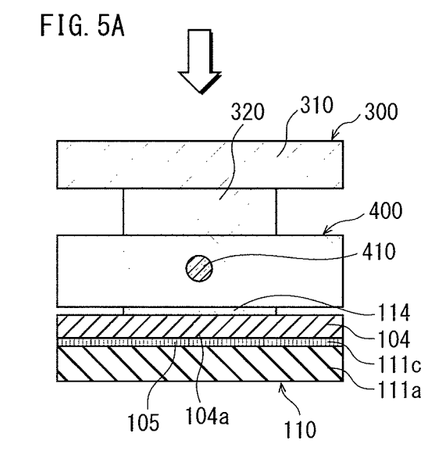
FIGS. 5A and 5B are conceptual diagrams for explaining connection structure of a display panel and a flexible circuit substrate relating to the embodiment.
Figure 5B:
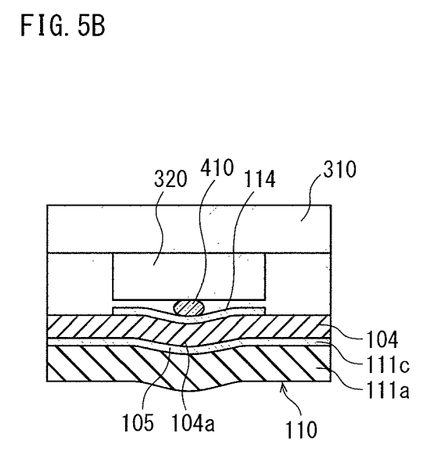

FIGS. 5A and 5B are conceptual diagrams for explaining connection structure of the display panel and the flexible circuit substrate relating to the embodiment. As illustrated in FIG. 5A, pressure is applied from above with the ACF 400 positioned between the first terminal part 114, provided above the cushioning layer 104a of the device substrate 110, and the second terminal part 320, provided on the base film 310 of the flexible circuit substrate 300. As illustrated in FIG. 5B, the ACF 400 is compression bonded to the device substrate 110 and the flexible circuit substrate 300, and the conductive particles 410 included in the ACF 400 are compressed by the first terminal part 114 and the second terminal part 320, thus electrically connecting the first terminal part 114 and the second terminal part 320 through the conductive particles 410. During the above, deformation of the first terminal part 114 is prevented by the cushioning layer 104a, and the conductive particles 410 can be compressed into appropriate flat shapes. The above ensures a large contact surface area between the first terminal part 114 and the conductive particles 410, and therefore reduces probability of a defect in electrical continuity occurring due to bad contact.

[Modified Examples]

The embodiment of the flexible display device relating to one aspect of the present invention is explained above as an example of the present invention in order to explain configuration and effects thereof. However, the present invention is not limited by the embodiment described above.

[Testing]

Figure 6A:
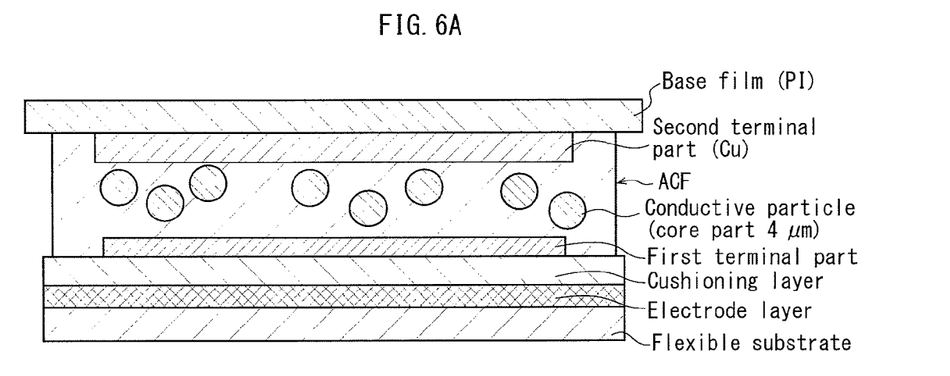
FIGS. 6A and 6B illustrate conditions for testing of deformation prevention effects.
Figure 6B:
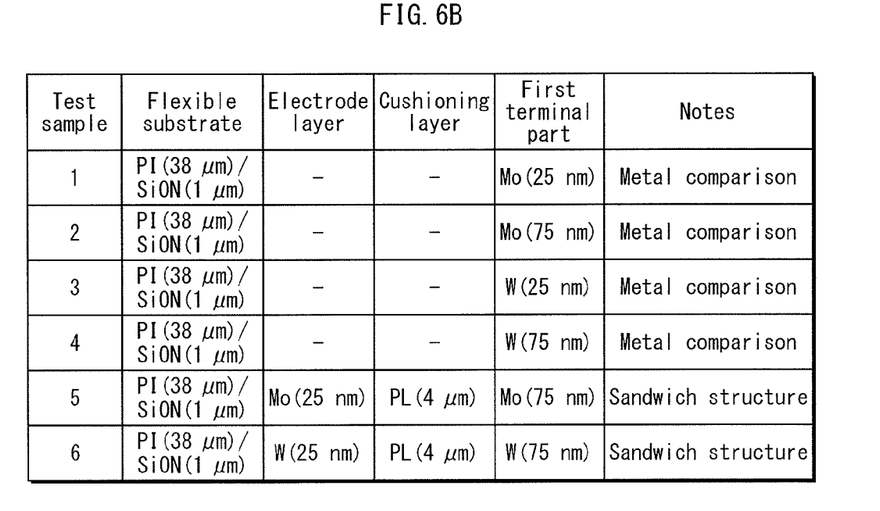

Testing was conducted in order to investigate how deformation of the terminal parts due to compression bonding is influenced by the cushioning layer. FIGS. 6A and 6B illustrate conditions for testing of deformation prevention effects. FIG. 6A is an outline diagram for explaining structure of test samples and FIG. 6B is a table for explaining materials used to configure the test samples.

As illustrated in FIG. 6A, an ACF was positioned between a first terminal part provided on a flexible substrate and a second terminal part provided on a base film. Also, a degree of deformation of the first terminal part caused by conductive particles during compression bonding of the ACF, was evaluated by observation of the test sample from below the flexible substrate.

The ACF included conductive particles consisting of a core part, formed from PP and of average particle diameter 4 μm, and a metal layer, formed from Ni and of average thickness 0.1 μm, which coated the core part. Compression bonding of the ACF was performed using a thermal-compression bonding device set at a temperature of 250° C., a time of 15 sec and a pressure of 0.12 MPa.

As illustrated in FIG. 6B, for each of test samples 1-6, a substrate, formed from PI, of average thickness 38 μm and having a SiON layer of average thickness 1 μm layered thereon, was used as the flexible substrate. A Mo layer of average thickness 25 nm was provided on the flexible substrate as the first terminal part in test sample 1. Likewise, a Mo layer of average thickness 75 nm, a W layer of average thickness 25 nm and a W layer of average thickness 75 nm were provided as the first terminal part in test samples 2-4 respectively.

Test samples 5 and 6 each had a structure such as illustrated in FIG. 6A. In test sample 5, a Mo layer of average thickness 25 nm, a passivation layer (PL) (resin) of average thickness 4 μm, and a Mo layer of average thickness 75 nm were provided on the flexible substrate as the electrode layer, the cushioning layer and the first terminal part respectively. In test sample 6, a W layer of average thickness 25 nm, a passivation layer of average thickness 4 μm, and a W layer of average thickness 75 nm were provided on the flexible substrate as the electrode layer, the cushioning layer and the first terminal part respectively.

Test samples 1-4 are conventional configurations in which no cushioning layer is provided. Test samples 5 and 6 are configurations of the present invention in which a cushioning layer is provided, and which have a sandwich structure provided with an electrode layer.

Elastic moduli of Mo, W, PP and Ni are approximately 290 GPa, 400 GPa, 1.5 GPa and 200 GPa respectively. The passivation layer has an elastic modulus of approximately 1.5 GPa. Based on the above, the quotient value of the sum of the core part product and the metal layer product, divided by the first terminal part product was calculated for each of test samples 1-4. Also, the quotient value of the sum of the core part product and the metal layer product, divided by the sum of the first terminal part product, the cushioning layer product and the electrode layer product was calculated for each of test samples 5 and 6.

The quotient value for test sample 1 was approximately 6.34 ([approx. 1.5 GPa×4.0 μm+approx. 200 GPa×0.1 μm×2]/[approx. 290 GPa×25 μm]).

The quotient value for test sample 2 was approximately 2.11 ([approx. 1.5 GPa×4.0 μm+approx. 200 GPa×0.1 μm×2]/[approx. 290 GPa×75 μm]).

The quotient value for test sample 3 was approximately 4.6 ([approx. 1.5 GPa×4.0 μm+approx. 200 GPa×0.1 μm×2]/[approx. 400 GPa×25 μm]).

The quotient value for test sample 4 was approximately 1.53 ([approx. 1.5 GPa×4.0 μm+approx. 200 GPa×0.1 μm×2]/[approx. 400 GPa×75 μm].

The quotient value for test sample 5 was approximately 1.31 ([approx 1.5 GPa×4.0 μm+approx. 200 GPa×0.1 μm×2]/[approx. 290 GPa×25 μm+approx. 1.5 GPa×4.0 μm+approx. 290 GPa×75 μm]).

The quotient value for test sample 6 was approximately 1.0 ([approx. 1.5 GPa×4.0 μm+approx. 200 GPa×0.1 μm×2]/[approx. 400 GPa×25 μm+approx. 1.5 GPa×4.0 μm+approx. 400 GPa×75 μm]).

FIGS. 7A-7F are electron microscope photographs illustrating results of the testing of deformation prevention effects. As illustrated in FIGS. 7A-7D, for each of test samples 1-4 considerable unevenness of the lower surface thereof was observed, the unevenness being to an extent indicating possibility of a defect in electrical continuity occurring. The above confirms that deformation of the first terminal part occurs in a configuration where the first terminal part is only provided as a metal film without provision of the cushioning layer. The above result was observed irrespective of thickness or elastic modulus of the first terminal part.

Figure 7A:
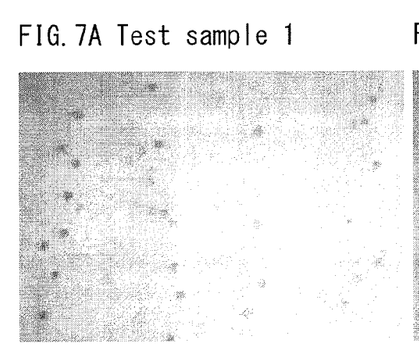
FIGS. 7A-7F are electron microscope photographs illustrating results of the testing of deformation prevention effects.
Figure 7B:
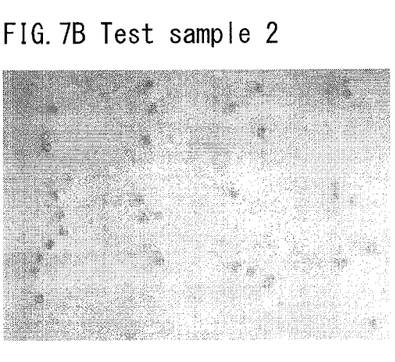
Figure 7C:
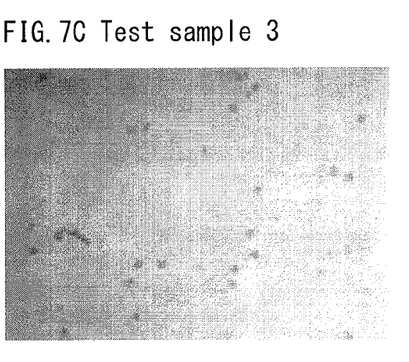
Figure 7D:
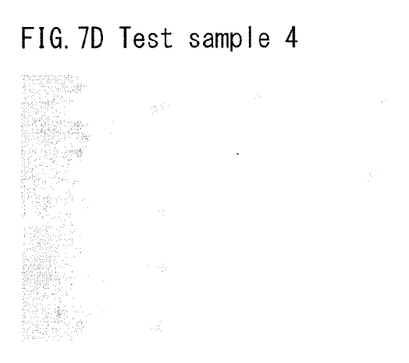
Figure 7E:
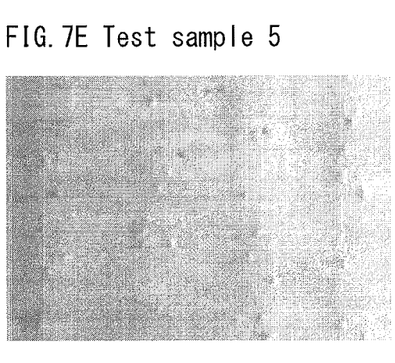
Figure 7F:
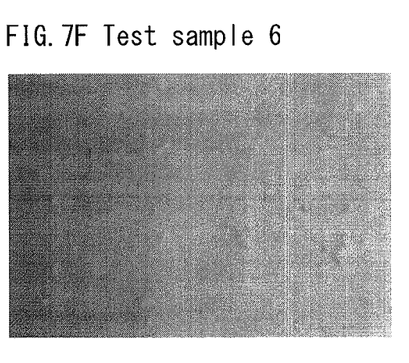

In contrast to the above, as illustrated in FIGS. 7E and 7F, for each of test samples 5 and 6 only slight unevenness of the lower surface thereof was observed, the unevenness not being to an extent indicating possibility of a defect in electrical continuity occurring. The above confirms that through provision of the electrode layer and the cushioning layer, an effect of preventing deformation of the first terminal part can be achieved.

Figure 8A:
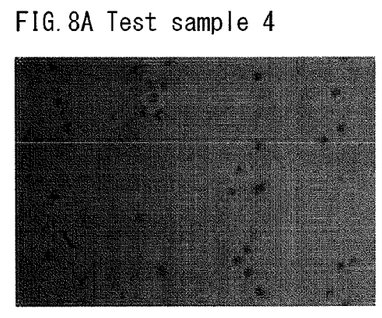
FIGS. 8A and 8B are electron microscope photographs illustrating results of the testing of deformation prevention effects.
Figure 8B:
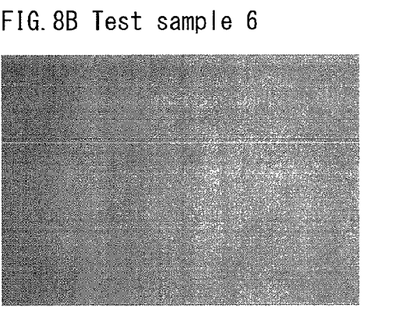

For test samples 4 and 6, the base film was removed in order to observe lower surfaces of the first terminal part and the electrode layer respectively. FIGS. 8A and 8B are electron microscope photographs illustrating results of the testing of deformation prevention effects. As illustrated in FIG. 8A, for test sample 4 considerable unevenness of the lower surface of the first terminal part was observed. On the other hand, as illustrated in FIG. 8B, for test sample 6 almost no unevenness of the lower surface of the electrode layer was observed. The above further confirms that through provision of the electrode layer and the cushioning layer, an effect of preventing deformation of the first terminal part is achieved.

In summary of the above, considerable unevenness was observed for test sample 4 of which the quotient value was approximately 1.53, while only slight unevenness was observed for test sample 5 of which the quotient value was approximately 1.31. Based on the above, prevention of deformation of the first terminal part is judged to be possible when the quotient value is no greater than 1.5.

Industrial Applicability

The flexible display device relating to the present invention is suitable for public or private use, and may be used commercially in various display devices, televisions, portable electronic device displays and the like.

Reference Signs List 1 flexible display device
101 display unit
104 base layer
104a cushioning layer
105 electrode layer
110 device substrate
111a flexible substrate
114 first terminal part
300 flexible circuit substrate
320 second terminal part
400 anisotropic conductive film
410 conductive particles
411 core part
412 metal layer

The invention claimed is:

1. A flexible display device comprising:
a device substrate including a flexible substrate, and a display unit and a first terminal part which are formed above the flexible substrate;
a flexible circuit substrate including a second terminal part; and
an anisotropic conductive film including conductive particles and connecting the first terminal part electrically and physically to the second terminal part, wherein
an electrode layer and a cushioning layer are provided between the flexible substrate and the first terminal part,
each of the conductive particles consists substantially of a core part and a metal layer which covers the core part,
a sum of a product of average particle diameter and elastic modulus for the core part, and a product of double average thickness and elastic modulus for the metal layer, is a first sum value,
a sum of a product of average thickness and elastic modulus for the first terminal part, a product of average thickness and elastic modulus for the cushioning layer, and a product of average thickness and elastic modulus for the electrode layer, is a second sum value, and
a quotient value of the first sum value divided by the second sum value is no greater than 1.5.

2. The flexible display device in claim 1, wherein
the cushioning layer is formed from a resin.

3. The flexible display device in claim 1, wherein
the first terminal part is plural in number and the cushioning layer is formed as a single layer, the single layer being provided in areas corresponding one-to-one to the plurality of the first terminal parts and continuously therebetween.

4. The flexible display device in claim 1, wherein
the first terminal part is plural in number and the cushioning layer is formed as a plurality of independent layers, each of the independent layers being provided in an area corresponding to one of the first terminal parts.

5. The flexible display device in claim 1, wherein
the electrode layer is thinner than the first terminal part.

6. The flexible display device in claim 1, wherein
the first terminal part and a pixel electrode of the display unit are formed during a same process.

7. The flexible display device in claim 1, wherein
the electrode layer and the first terminal part are electrically connected through a via connection part.

8. The flexible display device in claim 1, wherein
a base layer which is continuous through a display unit formation region where the display unit is formed, a terminal part formation region where the first terminal part is formed, and an intermediate region between the display unit formation region and the terminal part formation region, is provided between the flexible substrate and the display unit, and
the cushioning layer is a part of the base layer located in the terminal part formation region.

9. The flexible display device in claim 8, wherein
the base layer is configured by at least one out of a partitioning wall, a passivation film and a planarizing film.

* * * * *